United States Patent
Sato

(10) Patent No.: US 6,300,650 B1
(45) Date of Patent: *Oct. 9, 2001

(54) OPTICAL SEMICONDUCTOR DEVICE HAVING A MULTILAYER REFLECTION STRUCTURE

(75) Inventor: Shunichi Sato, Miyagi (JP)

(73) Assignee: Ricoh Company, Ltd., Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/263,104

(22) Filed: Mar. 5, 1999

Related U.S. Application Data

(62) Division of application No. 08/921,151, filed on Aug. 29, 1997, now Pat. No. 6,002,700.

(30) Foreign Application Priority Data

Aug. 30, 1996 (JP) .................................... 8-248930

(51) Int. Cl.⁷ ............................................... H01L 31/0232
(52) U.S. Cl. ......................... 257/184; 257/201; 257/436; 257/437; 438/72; 438/94
(58) Field of Search ................................. 257/437, 436, 257/184, 201; 438/72, 94

(56) References Cited

U.S. PATENT DOCUMENTS

| | | | |
|---|---|---|---|
| 4,529,685 | * 7/1985 | Borodovsky | 430/311 |
| 5,805,624 | * 9/1998 | Yang et al. | 372/45 |
| 5,815,524 | * 9/1998 | Ramdani et al. | 372/96 |
| 5,883,912 | * 3/1999 | Ramdani et al. | 372/45 |
| 6,002,700 | * 12/1999 | Sato | 372/45 |

FOREIGN PATENT DOCUMENTS

| | | |
|---|---|---|
| 6-37355 | 2/1994 | (JP) . |
| 6-132605 | 5/1994 | (JP) . |

OTHER PUBLICATIONS

Markus Weyers et al., Red Shift Of Photoluminescence and Absorption in Dilute GaAsN Alloy Layers, Japanese Journal Appl. Phys. vol. 31 (1992), pp. 853–855, Part 2, No. 7A, Jul. 1992.

* cited by examiner

*Primary Examiner*—William Mintel
(74) *Attorney, Agent, or Firm*—Dickstein Shapiro Morin & Oshinsky LLP

(57) ABSTRACT

A multilayer mirror includes a multilayer reflection structure formed of an alternate repetition of a first epitaxial layer of a first refractive index and a second epitaxial layer of a second refractive index larger than the first refractive index, wherein the second epitaxial layer includes a group III–V mixed crystal containing N as a group V element.

6 Claims, 5 Drawing Sheets

OPTICAL SEMICONDUCTOR DEVICE HAVING A MULTILAYER REFLECTION STRUCTURE

This application is a divisional of application Ser. No. 08/921,151 filed on Aug. 29, 1997, now U.S. Pat. No. 6,002,700, which is hereby incorporated by reference.

BACKGROUND OF THE INVENTION

The present invention generally relates to optical semiconductor devices and more particularly to an optical semiconductor device that uses a multilayer reflector.

A multilayer reflector is an optical reflector formed of an alternate repetition of first and second layers having respective refractive indices. As a result of such an alternate repetition of the first and second layers, there appears a periodically changing profile of refractive index in the multilayer reflector, while such a periodically changing refractive index profile causes a Bragg reflection in the optical beam incident thereto with a wavelength that satisfies a condition of Bragg reflection. A multilayer reflector is easily formed on a semiconductor structure by an epitaxial process. Thus, the multilayer reflector is used extensively in so-called vertical-cavity surface-emitting laser diode that emits an optical beam perpendicularly to the epitaxial layers.

In a vertical-cavity surface-emitting laser diode, a multilayer reflector is disposed up and below an active layer in which optical radiation is produced as a result of stimulated emission. Thus, a vertical-cavity surface-emitting laser diode is suitable for integration on a semiconductor substrate in the form of two-dimensional array. In relation to this advantageous feature, an extensive application is expected for a vertical-cavity surface-emitting laser diode as an optical source of various optical telecommunication systems, optical information processing systems or optical interconnection switches.

A laser diode for use in optical telecommunication or optical information processing is generally designed to produce an output optical beam in the 1.3 μm or 1.5 μm wavelength band, in view of the optical transmission band of the optical fiber used in such conventional optical telecommunication or optical information processing systems as an optical transmission medium. In relation to the foregoing specific wavelength band, the conventional laser diodes for use in optical telecommunication or optical information processing have used GaInPAs for the active layer. Further, in relation to the use of the GaInPAs active layer, the conventional laser diodes, including the vertical-cavity surface-emitting laser diodes, have used InP for the substrate. Thereby, the GaInPAs active layer has a composition such that a lattice matching is achieved to the InP substrate while simultaneously having a bandgap energy corresponding to the foregoing optical wavelength band of 1.3 μm or 1.5 μm. Alternatively, the GaInPAs active layer has a composition so as to accumulate a strain therein. In the latter case, the active layer has to be formed to have a thickness not exceeding a critical thickness of the strained heteroepitaxial system formed of the GaInPAs active layer and the InP substrate. When the thickness of the GaInPAs active layer has exceeded the critical thickness, an extensive formation of lattice misfit dislocations would occur in the GaInPAs active layer.

In the foregoing vertical-cavity surface-emitting laser diode for telecommunication applications, a first multilayer reflector is provided between the InP substrate and the GaInPAs active layer, while a second multilayer reflector is provided on the top part of the device. For example, the second multilayer reflector may be provided on a cladding layer covering the GaInPAs active layer.

The multilayer reflector used in the conventional 1.3 μm or 1.5 μm band vertical-cavity surface-emitting laser diode is typically formed of an alternate repetition of a first epitaxial layer of InP and a second epitaxial layer of GaInPAs in view of the need of maintaining a lattice matching to the InP substrate. However, the heteroepitaxial system of GaInPAs and InP has a drawback in that the change of the refractive index is very small. In terms of the refractive index difference between the first epitaxial layer and the second epitaxial layer, the change is only in the order of about 0.25. Thus, in order that the multilayer reflector is effective, it has been necessary to increase the number of stacks of the first and second epitaxial layers in the multilayer reflector. For example, it has been necessary to stack the first and second epitaxial layers 40 times or more in order to achieve a desired reflectance of 99.9%. However, such an increased number of stacks of the first and second epitaxial layers increases the time needed for forming the epitaxial structure of the multilayer reflector, and the throughput of production of the laser diode is decreased inevitably. Further, such an increased number of stacks inevitably leads to an increased thickness of the multilayer reflection structure and hence an increased step height. Thereby, the fabrication of the laser diode becomes substantially difficult. For example, a conventional multilayer reflection structure may have a total thickness of as much as about 20 μm, while the multilayer reflection structure having such a very large thickness tends to suffer from the problem of variation in the thickness of the first and second epitaxial layers in the thickness direction. When this occurs, the desired high reflectance is not achieved. In order that the multilayer reflection structure is to be effective, it is necessary that each of the first and second epitaxial layers in the structure has a thickness corresponding to one-quarter (λ/4) of the wavelength of the optical beam to be reflected.

In order to eliminate the foregoing problem, the Japanese Laid-Open Patent Publication 6-132605 describes a laser diode that uses a strained buffer layer of GaInPAs formed on an InP substrate. The buffer layer has a composition that induces a lattice misfit to the underlying InP substrate and carries thereon an active layer of GaInPAs that achieves a lattice matching to the buffer layer, with a first multilayer reflection structure and a first cladding layer interposed in this order between the buffer layer and the active layer. The first multilayer reflection structure includes an alternate repetition of a first epitaxial layer of AlInAs and a second epitaxial layer of GaInPAs having a composition of $Ga_{x1}In_{1-x1}P_{y1}As_{1-y1}$ ($0 \leq x_1 \leq 1$, $0 \leq y1 \leq 1$) each having a thickness corresponding to a quarter of the wavelength (λ/4) of the optical beam to be reflected, wherein the first and second epitaxial layers have respective compositions selected so as to establish a lattice matching to the buffer layer. Further, the first cladding layer is formed of GaInPAs having a composition $Ga_{x2}In_{1-x2}P_{y2}As_{1-y2}$, which is set such that the first cladding layer establishes a lattice matching to the buffer layer.

The active layer of GaInPAs is provided on the first cladding layer noted above, wherein the active layer has a composition of $Ga_{x3}In_{1-x3}P_{y3}As_{1-y3}$ ($0 \leq x3 \leq 1$, $0 \leq y3 \leq 1$) selected such that the active layer establishes a lattice matching to the buffer layer. Further, a second cladding layer of GaInPAs having a composition of $Ga_{x4}In_{1-x4}P_{y4}As_{1-y4}$ ($0 \leq x4 \leq 1$, $0 \leq y4 \leq 1$) is provided on the active layer in lattice matching to the foregoing buffer layer, and a second multilayer reflection structure similar to the first multilayer reflection structure is provided on the second cladding layer. Thus, the second multilayer reflection structure is formed of an alternate repetition of a third epitaxial layer of AlInAs and a fourth epitaxial layer of GaInPAs having a composition of $Ga_{x5}Iv_{1-x5}P_{y5}As_{1-y5}$ ($0 \leq x5 \leq 1$, $0 \leq y5 \leq 1$) both achieving a lattice matching to the buffer layer.

In this prior art laser diode, the epitaxial layers forming the first multilayer reflection structure, the first cladding layer, the active layer, the second cladding layer and the second multilayer reflection structure, all have a composition that achieves a lattice matching to the GaInPAs buffer layer. In other words, all the foregoing layers, including the buffer layer, have a lattice constant smaller than the lattice constant of InP and intermediate to the lattice constant of GaAs. Thereby, it becomes possible to increase the refractive index difference between the first and second epitaxial layers of the first multilayer reflection structure or between the third and fourth epitaxial layers of the second multilayer reflection structure, by using a combination of AlInAs and GaInPAs or AlInP and GaInPAs for the first and second epitaxial layers or for the third and fourth epitaxial layers. As a result, the number of stacks of the first and second epitaxial layers necessary for achieving a desired reflectance for the first or second multilayer reflection structure is reduced substantially.

However, the foregoing conventional laser diode inherently relies upon a strained system constructed on the InP substrate, and the laser diode tends to suffer from the problem of deterioration of device performance due to the creation of misfit dislocations and the like pertinent to a strained heteroepitaxial system. Further, the foregoing prior art laser diode has suffered from a poor high temperature performance due to the relatively small band discontinuity between the active layer and the first or second cladding layer. Because of the small band discontinuity, the carriers in the active layer experience a poor carrier confinement, and the oscillation characteristic of the laser diode deteriorates rapidly with increasing temperature due to the overflowing of the carriers away from the active layer.

In view of the foregoing poor high-temperature performance of the vertical-cavity surface-emitting laser diode, there is also a proposal to form an epitaxial layer of GaInAs on a GaAs substrate for maximizing the band discontinuity in the conduction band. When a GaInAs layer is used, the bandgap energy of GaInAs decreases with increasing In content. On the other hand, the increased In content in such a GaInAs mixed crystal leads to an increased lattice constant and hence increased compressional strain when the mixed crystal layer is grown on a GaAs substrate, while the increased compressional strain in the GaInAs active layer acts to decrease the bandgap thereof further. In this way, the laser oscillation wavelength of the laser diode can be increased up to about 1.1 μm due to the effect of increased In content and the effect of accumulation of the compressional strain, while the foregoing oscillation wavelength of about 1.1 μm is thought to be the maximum wavelength that can be reached according to such an approach. An oscillation wavelength of 1.3 μm or 1.5 μm needed for optical telecommunication or optical information processing is not realized.

On the other hand, the Japanese Laid-Open Patent Publication 6-37355 describes a laser diode that uses a mixed crystal of GaInNAs as an active layer in combination with a substrate of GaAs. According to the teaching of the foregoing prior art, it becomes possible to set the composition of the GaInNAs mixed crystal such that the GaInNAs mixed crystal establishes a lattice matching to the GaAs substrate while simultaneously realizing a laser oscillation at the wavelength of 1.3 μm or 1.5 μm.

FIG. 1 shows the band diagram of various group III–V compound semiconductor materials including the foregoing GaInNAs mixed crystal.

Referring to FIG. 1, it will be noted that there appears a very large negative bowing in the bandgap energy in the mixed crystal system of GaAs-GaN and the bandgap energy of a GaAs mixed crystal decreases with increasing In content. GaN itself has a very large bandgap and is used for an LED or laser diode that emits a blue or violet radiation. Further, by incorporating In with an appropriate amount into a GaInNAs mixed crystal, it is possible to adjust the bandgap energy below the bandgap energy of GaAs while maintaining the lattice constant identical to the lattice constant of GaAs. Thus, by using the GaInNAs mixed crystal for the active layer, it becomes possible to fabricate a laser diode, including the vertical-cavity surface-emitting laser diode, on a GaAs substrate in lattice matching thereto.

In such a vertical-cavity surface-emitting laser diode operable in the 1.3 μm band and constructed on a GaAs substrate, it should be noted that each of the multilayer reflection structures up and below the active layer and corresponding to the foregoing first and second multilayer reflection structures, are formed of an alternate repetition of an AlGaAs layer and a GaAs layer. As a result of the use of the AlGaAs layer and the GaAs layer in the first and second multilayer reflection structures, a large refractive index is secured between the first and second layers or between the third and fourth layers noted previously, and the number of stacks needed for the effective performance of the reflective structure can be reduced, from about forty for the case of constructing the laser diode on an InP substrate, to about twenty.

However, in view of the large wavelength of the optical radiation in the 1.3 μm band, the thickness of each of the first and second or third and fourth layers is increased inevitably as compared with a conventional laser diode operable in the 0.8 μm band, and the problem of increase of total thickness of the multilayer reflection structure is not entirely resolved. In a multilayer reflection structure, it should be noted that each of the layers has to have a thickness corresponding to one-quarter the wavelength (λ/4) of the optical radiation to be reflected as noted previously.

SUMMARY OF THE INVENTION

Accordingly, it is a general object of the present invention to provide a novel and useful optical semiconductor device wherein the foregoing problems are eliminated.

Another and more specific object of the present invention is to provide an optical semiconductor device having a multilayer reflection structure that provides a large reflectance.

Another object of the present invention is to provide a multilayer mirror, comprising:

a substrate; and a multilayer reflection structure provided on said substrate, said multilayer reflection structure comprising an alternate repetition of a first epitaxial layer of a first refractive index and a second epitaxial layer of a second refractive index larger than said first refractive index;

said second epitaxial layer comprising a group III–V mixed crystal containing N as a group V element.

Another object of the present invention is to provide a vertical-cavity surface-emitting laser diode, comprising:

a substrate;

a first multilayer reflection structure provided on said substrate, said first multilayer reflection structure comprising an alternate repetition of a first epitaxial layer of a first refractive index and a second epitaxial layer of a second refractive index larger than said first refractive index;

a first cladding layer provided on said first multilayer reflection structure;

an active layer provided on said first cladding layer;

a second cladding layer provided on said active layer;

a second multilayer reflection structure provided on said second cladding layer, said second multilayer reflection structure comprising an alternate repetition of a third epitaxial layer of a third refractive index and a fourth epitaxial layer of a fourth refractive index larger than said third refractive index;

a first ohmic electrode in electrical connection to said first cladding layer; and a second ohmic electrode in electrical connection to said second cladding layer;

said first and second multilayer reflection structures being disposed so as to face each other across said active layer;

said second and fourth epitaxial layers comprising a group III–V compound mixed containing N as a group V element.

Another object of the present invention is to provide a photodetector, comprising:

a semiconductor substrate having a first conductivity type;

an optical absorption layer of an undoped semiconductor material provided on said substrate;

a semiconductor layer having a second, opposite conductivity type and provided on said optical absorption layer;

a multilayer anti-reflection structure provided on said semiconductor layer, said multilayer anti-reflection structure comprising an alternate repetition of a first epitaxial layer having a first refractive index and a second epitaxial layer having a second refractive index larger than said first refractive index, said second layer comprising a group III–V compound semiconductor material containing N as a group V element.

According to the present invention, a very large refractive index difference is secured between the first epitaxial layer and the second epitaxial layer forming the multilayer reflection structure or the multilayer anti-reflection structure, and the number of stacks of the first and second epitaxial layers in the reflection or anti-reflection structure is reduced. Thereby, the reflection or anti-reflection structure has a reduced overall thickness and the fabrication of the laser diode or photodiode is facilitated substantially.

DETAILED DESCRIPTION OF THE PREFERRED EMBODIMENTS

[Principle]

The inventor of the present invention has conducted a series of ellipsometric experiments on a GaInNAs mixed crystal film grown on a GaAs substrate with a composition of $Ga_{0.87}In_{0.13}N_{0.04}As_{0.96}$. The foregoing composition is set such that the GaInNAs mixed crystal establishes a lattice matching to the GaAs substrate and such that the bandgap energy of the GaInNAs mixed crystal is tuned to the 1.3 $\mu$m wavelength band.

The deposition of the GaInNAs mixed crystal is conducted by an MOVPE process at a temperature of about 630° C. while supplying TMG (trimethylgallium), TMI (trimethylindium), $AsH_3$ and DMHy (dimethylhydradine) as respective sources of Ga, In, As and N, together with a carrier gas of $H_2$.

Figure 2:
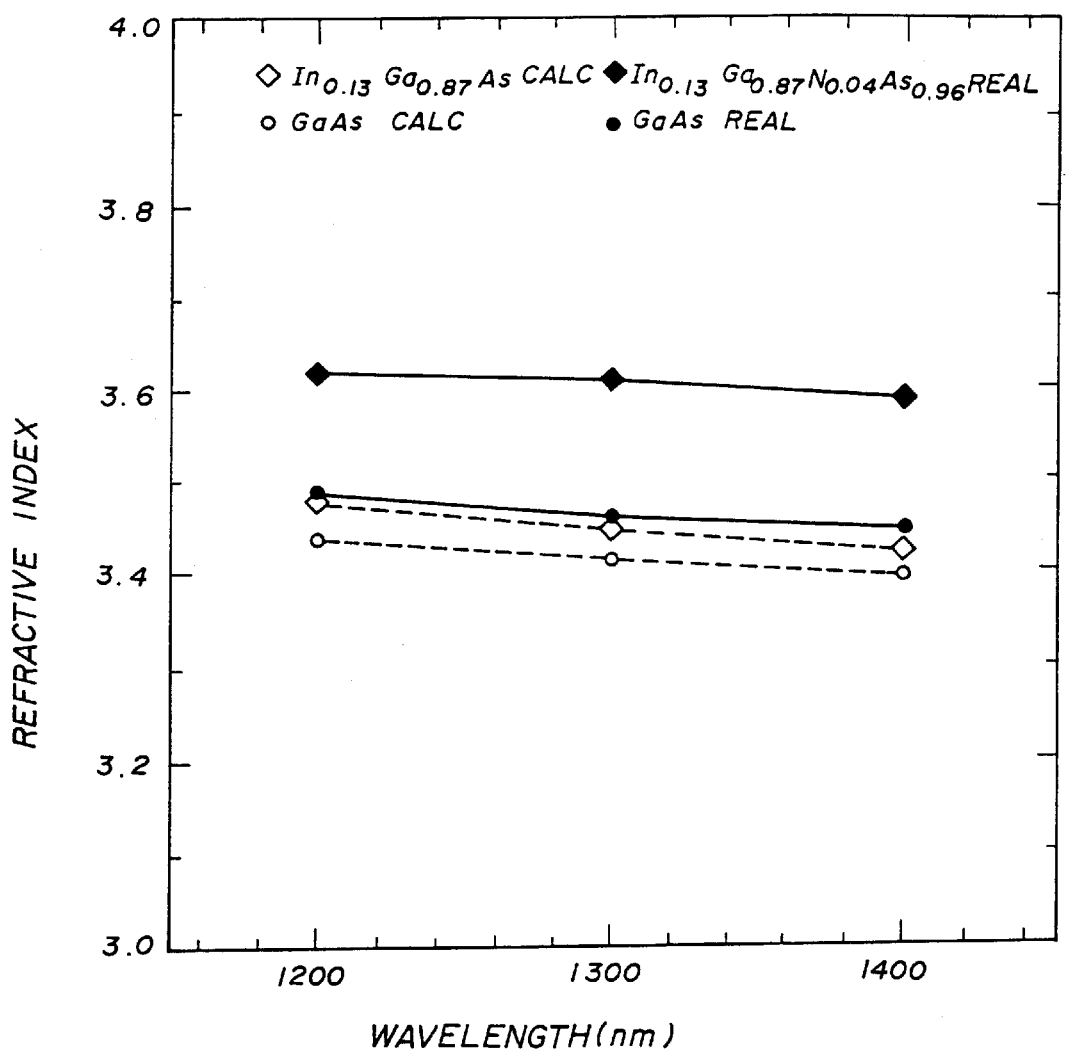
FIG. 2 is a diagram showing the refractive index of a GaInNAs mixed crystal in comparison with the refractive index of GaAs.

FIG. 2 shows the refractive index of the GaInNAs mixed crystal thus formed on a GaAs substrate with a composition of $Ga_{0.87}In_{0.13}N_{0.04}As_{0.96}$ and a thickness of 1.3 $\mu$m as well as the refractive index of GaAs observed by an ellipsometry for various optical wavelengths, in comparison with calculated refractive indices of GaInAs having a composition of $Ga_{0.87}In_{0.13}As$ and GaAs. The calculated refractive indices are obtained by a MSEO (modified single effective oscillator) model.

Referring to FIG. 2, it should be noted that the observed refractive index and the calculated refractive index agree each other more or less for GaAs, while it was discovered that the observed refractive index of the GaInNAs mixed crystal is substantially higher than the expected or calculated refractive index. In the illustrated example, the observed refractive index of the GaInNAs mixed crystal is larger than that of GaAs by as much as 0.15, while only a refractive index difference of 0.03 is expected from the theoretical prediction. The result of FIG. 2 clearly indicates a substantial effect of N for increasing the refractive index. The refractive index thus achieved for the foregoing GaInNAs mixed crystal is even larger than the refractive index of InGaAs, which is hitherto supposed at the material that provides the largest refractive index while simultaneously achieving a lattice matching to GaAs.

[First Embodiment]

Figure 3:
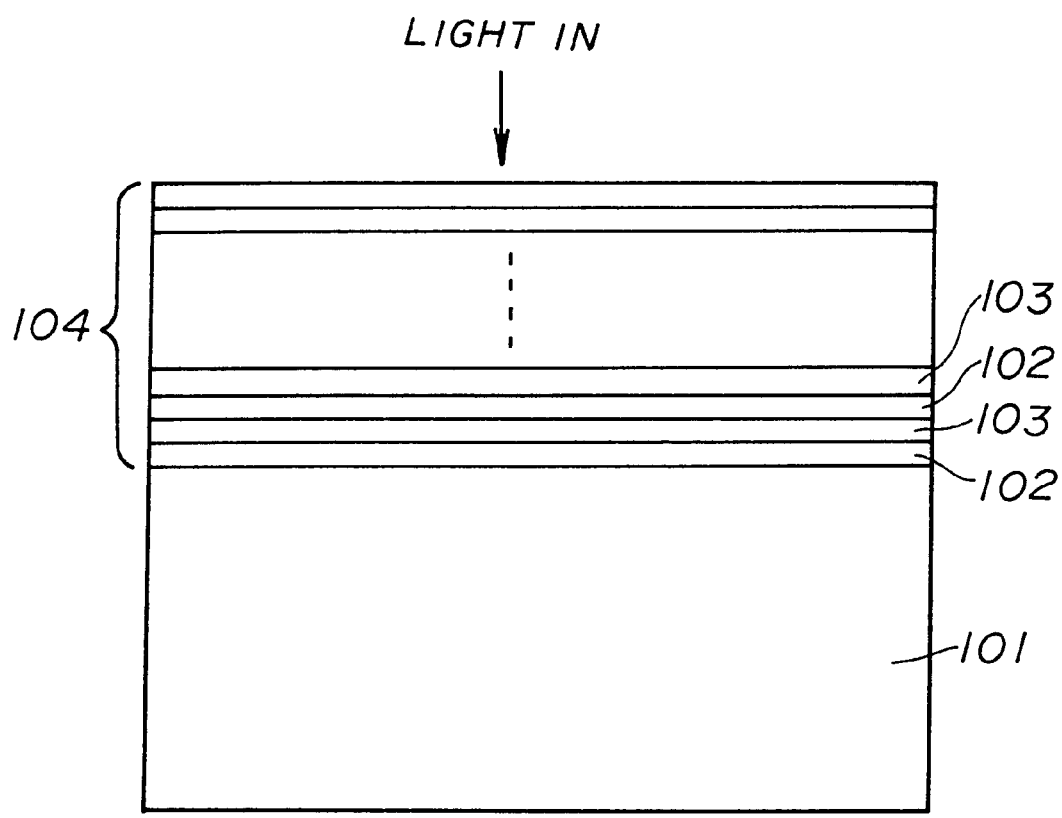
FIG. 3 is a diagram showing the construction of a multilayer mirror according to a first embodiment of the present invention.

FIG. 3 shows the construction of a multilayer mirror 100 according to a first embodiment of the present invention.

Referring to FIG. 3, the multilayer mirror 100 is designed to reflect an optical radiation of the 1.5 $\mu$m wavelength band and includes a GaAs substrate 101 and a multilayer reflection structure 104 provided thereon, wherein the multilayer reflection structure 104 is formed of an alternate repetition of a high refractive index layer 103 of GaInNAs having a thickness of about 104.7 nm and a low refractive index layer 102 of AlAs having a thickness of 129.3 nm. The thicknesses of the layers 102 and 103 are set in correspondence to one-quarter the wavelength of 1.5 $\mu$m. The GaInNAs layer 103 has a composition of $Ga_{0.87}In_{0.13}N_{0.04}As_{0.96}$, wherein the composition successfully achieves a lattice matching to the GaAs substrate 101.

The deposition of the layers 102 and 103 may be carried out by an MOVPE process while supplying the source gases of TMA (trimethylaluminum) and $AsH_3$ when growing the AlAs layer 102 and supplying the source gases of TMG, TMI, DMHy and $AsH_3$ when growing the GaInNAs layer 103 while setting the substrate temperature to about 630° C. In place of using DMHy, it is also possible to use an RF-excited $N_2$ gas or a gaseous nitride compound as a source of N when growing the GaInNAs layer 103. Further, the deposition may be made by using an MBE (molecular beam epitaxy) process.

It should be noted that the layers 102 and 103 forming the multilayer reflection structure 104 have respective refractive indices of 2.9 and 3.6, while it should be noted that the refractive index difference thus achieved in the multilayer reflection structure 104 between the layers 102 and 103 is much larger than the refractive index difference of 0.5 achieved between a GaAs layer and an AlAs layer. Thereby, a reflectance of 99.9% is achieved by repeating the stacking of the layers 102 and 103 only 16 times. This is less than one-half of the number of repetitions or stacks required in the conventional multilayer reflection structure formed of an alternate repetition of InGaAsP and InP used in the 1.5 $\mu$m band vertical-cavity surface emitting laser diode. Further, this number of the stacks is even smaller than the case of using a stacking of AlAs and GaAs layers. In the former case, a repetition of about 40 times or more has been needed, while in the latter case, a repetition of about 20 times has been needed for achieving the same reflectance of 99.9%.

As the number of stacks of the layers 102 and 103 can be reduced in the multilayer mirror 100 of the present embodiment, the multilayer reflection structure 104 of the mirror 100 can be formed with a reduced thickness. Even in comparison with the case of using the GaAs layer and AlAs layer, the thickness of the multilayer reflection structure 104 can be reduced to about 80% or less. As the GaInNAs layer 103 of the foregoing composition has a bandgap energy of about 1.3 $\mu$m, no substantial absorption occurs in the optical beam of 1.5 $\mu$m wavelength band, which is to be reflected by the multilayer mirror 100.

In the present embodiment, it is possible to add Al or P further to the GaInNAs mixed crystal forming the epitaxial layer 103. However, the addition of these light elements to GaInNAs mixed crystal tends to cause a decrease of the refractive index, and the amount of Al or P that can be added to the GaInNAs mixed crystal is relatively limited.

[Second Embodiment]

Figure 4:
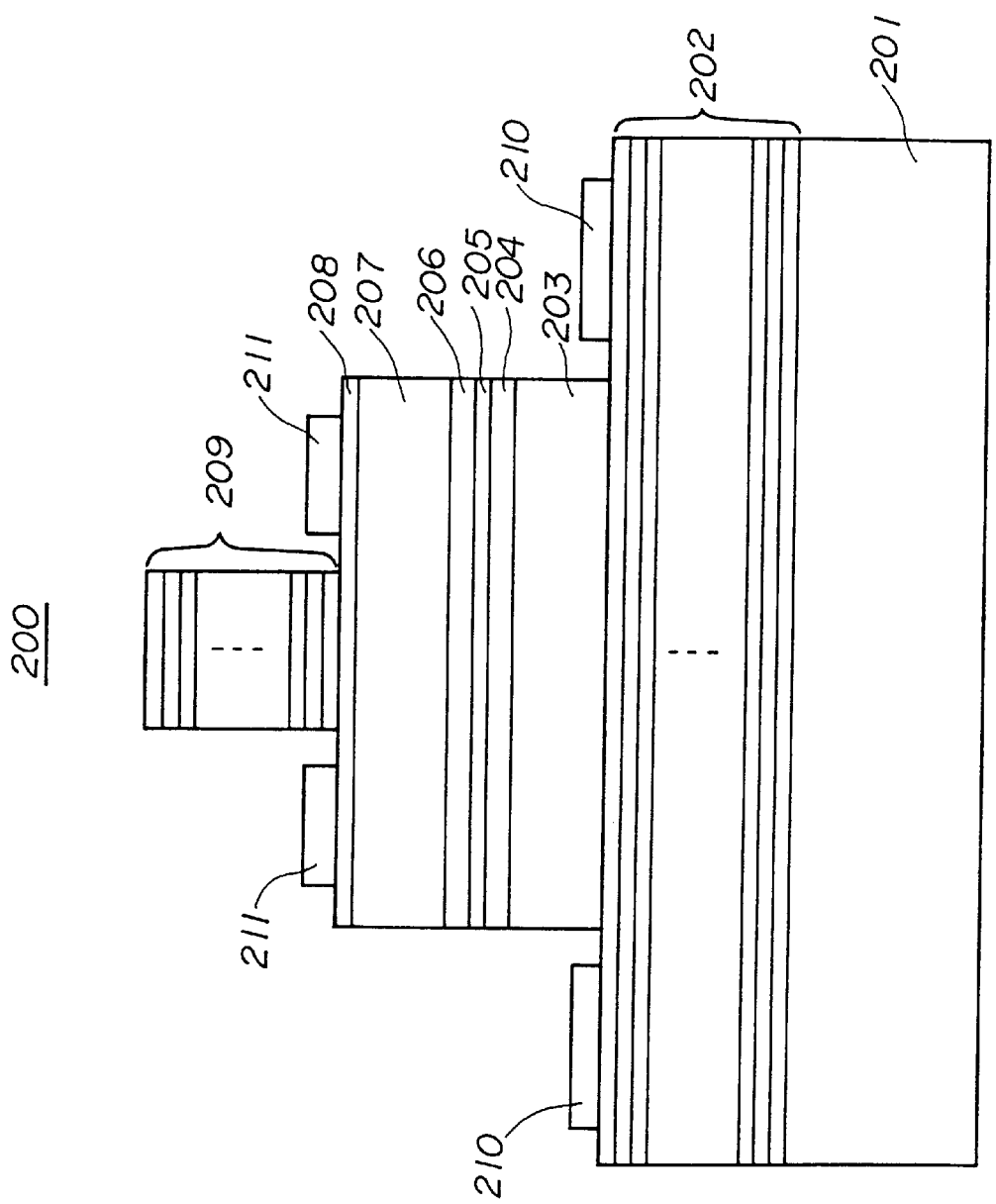
FIG. 4 is a diagram showing the construction of a vertical-cavity surface-emitting laser diode according to a second embodiment of the present invention.

FIG. 4 shows the construction of a vertical-cavity surface-emitting laser diode 200 according to a second embodiment of the present invention.

Referring to FIG. 4, the laser diode 200 is constructed on a substrate 201 of n-type GaAs on which a lower multilayer reflection structure 202 is provided. The multilayer reflection structure 202 is formed of an alternate stacking of an n-type GaInNAs epitaxial layer having a thickness of 104.7 nm and an n-type AlAs epitaxial layer having a thickness of 129.3 nm similarly to the layers 102 and 103 of the multilayer structure 104 of FIG. 3. In other words, the multilayer reflection structure 202 is tuned to the 1.5 $\mu$m wavelength band optical radiation.

In the example of FIG. 4, the GaInNAs epitaxial layers have a composition of $Ga_{0.87}In_{0.13}N_{0.04}As_{0.96}$ similarly to the embodiment of FIG. 3, and the AlAs epitaxial layer and the GaInNAs epitaxial layer are repeated by 19 times, wherein the deposition of the AlAs epitaxial layer and the deposition of the GaInNAs epitaxial layer are carried out similarly to the layers 102 and 103, except that an n-type dopant gas such as $SiH_4$ is added to the gaseous sources. As the GaInNAs epitaxial layers have a bandgap energy corresponding to the 1.3 $\mu$m optical radiation, no substantial absorption occurs in the optical radiation having the foregoing 1.5 $\mu$m band wavelength.

Figure 1:
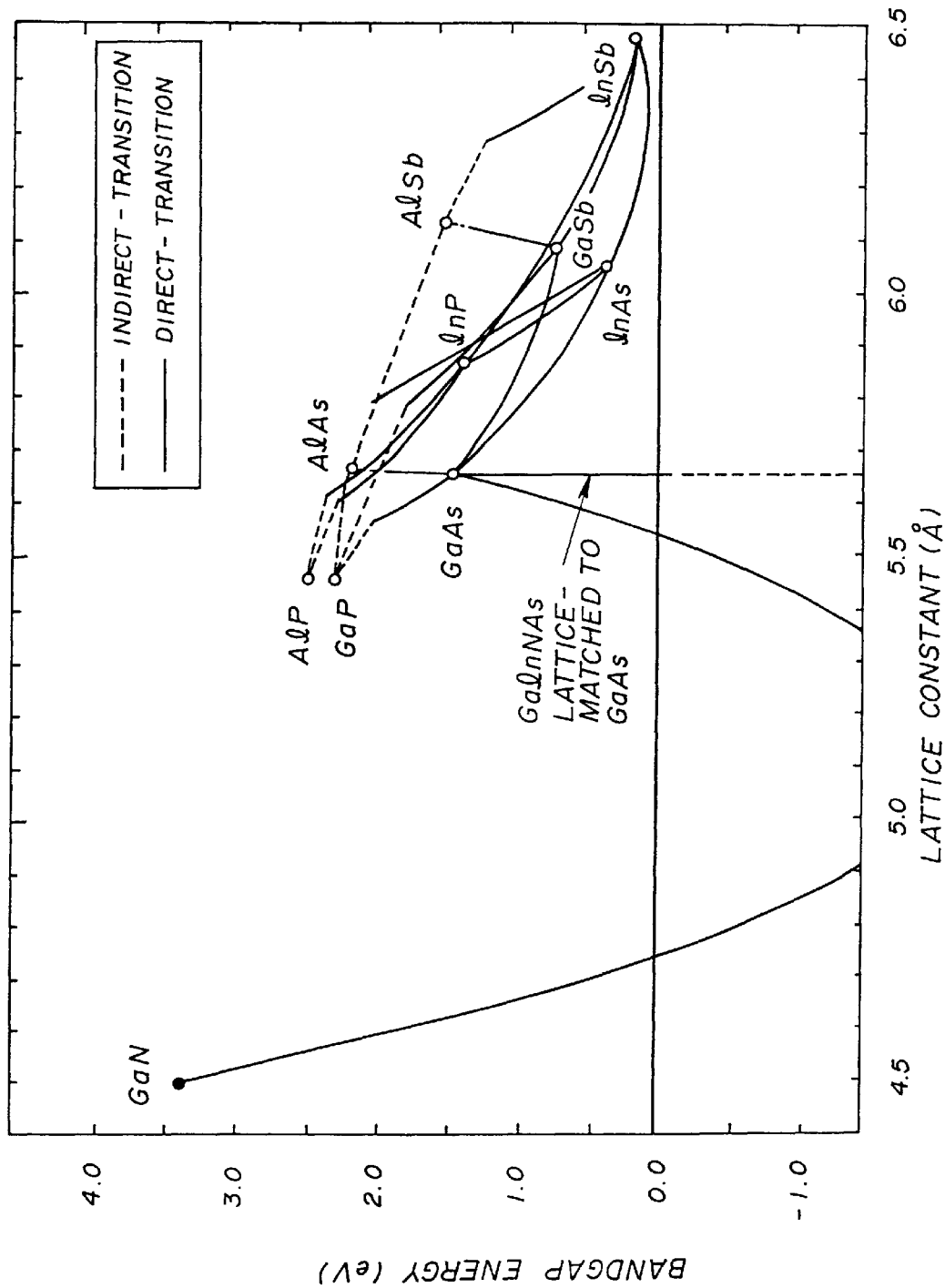
FIG. 1 is a diagram showing the band structure of group III–V semiconductor materials.

On the lower multilayer reflection structure 202 thus formed, a lower cladding layer 203 of n-type AlGaAs is provided epitaxially with a thickness of typically about 500 nm, and a lower optical waveguide layer 204 of undoped GaAs is provided on the lower cladding layer 203 epitaxially with a thickness of typically about 50 nm. Further, an active layer 205 of GaInNAs having a composition of $Ga_{0.7}In_{0.3}N_{0.02}As_{0.98}$ is provided on the lower optical waveguide layer 204 epitaxially with a thickness of typically 10 nm, wherein the foregoing composition of the active layer 205 is chosen such that the active layer has the bandgap energy of the 1.5 $\mu$m wavelength band and simultaneously establishes a lattice matching to the GaAs substrate 201. See the band diagram of FIG. 1.

On the active layer 205, an upper optical waveguide layer 206 of undoped GaAs is provided similarly to the lower optical waveguide layer 204, and an upper cladding layer 207 of p-type AlGaAs cladding layer is provided further on the upper optical waveguide layer 206 similarly to the lower cladding layer 203, except that the conductivity type is changed to the p-type.

On the upper cladding layer 207, a contact layer 208 of p-type GaAs is provided epitaxially with a thickness of typically about 100 nm, and an upper multilayer reflection structure 209 is formed on the contact layer 208 similarly to the lower multilayer reflection structure 202, wherein the upper multilayer reflection structure 209 is formed of an alternate repetition of a GaInNAs epitaxial layer having the composition of $Ga_{0.87}In_{0.13}N_{0.04}As_{0.96}$ and a thickness of 104.7 nm and an AlAs epitaxial layer having a thickness of 129.3 nm in correspondence to the one-quarter wavelength ($\lambda/4n$; n is refractive index) of the 1.5 $\mu$m band optical radiation produced by the laser diode 200, wherein the AlAs epitaxial layer and the GaInNAs epitaxial layer are repeated 16 times in the upper multilayer reflection structure 209.

The layered structure thus formed is then subjected to a dry etching process to expose a top surface of the lower multilayer reflection structure 202, and an n-type ohmic electrode having a stacked structure of AuGe/Ni/Au is provided on the exposed top surface of the lower multilayer reflection structure 202. Further, the upper multilayer reflection structure 209 is subjected to a dry etching process such that the top surface of the contact layer 208 is exposed, and a p-type ohmic electrode having a Cr/Au stacked structure is provided on the exposed top surface of the contact layer 208.

In the laser diode 200 thus formed, the lower and upper multilayer reflection structures 202 and 209 oppose with each other across the active layer 204, and the optical radiation of the 1.5 $\mu$m band produced in the active layer 204 is amplified by stimulated emission as it is reflected back and forth in the optical cavity thus formed by the lower and upper multilayer reflection structures 202 and 209. The optical radiation thus amplified then exits through the upper multilayer reflection structure 209 in the form of a coherent output optical beam. No substantial absorption of the optical radiation occurs in the GaInNAs epitaxial layer forming the multilayer reflection structure 202 or 209 due to the increased bandgap energy thereof corresponding to the 1.3 $\mu$m optical wavelength. It is also possible to obtain the output optical beam through the GaAs substrate 201.

In the laser diode 200 of the present embodiment, the number of stacks of the AlAs epitaxial layer and the GaInNAs epitaxial layer in the upper and lower multilayer reflection structures 202 and 209 can be reduced due to the large refractive index difference between the GaInNAs mixed crystal and the AlAs crystal. When the stack of InAlAs and InGaAsP is used for the multilayer reflection structures 202 and 209 as is practiced conventionally, the stack would have to be repeated at least 40 times in order to realize a satisfactory optical cavity. Thus, the laser diode 200 of the present embodiment is easy to fabricate with a low cost.

In the present embodiment, it should be noted that the composition of the GaInNAs mixed crystal used in the multilayer reflection structure 202 or 209 is by no means limited to the foregoing specific composition. In view of increasing the refractive index, it is desired to increase the In content and N content further, while such an increase of the refractive index is accompanied with a decrease of the bandgap energy. Thus, in order to avoid the optical absorption of the optical radiation in the desired 1.5 μm band, it is preferable not increase the In content and the N content excessively.

Further, it should be noted that the laser diode 200, thus based on the lattice matched heteroepitaxial system of GaAs and GaInNAs, has a further advantageous feature of allowing the use of AlGaAs for the lower and upper cladding layers 203 and 207. As a result of the use of AlGaAs for the lower and upper cladding layers 203 and 207, a large band discontinuity is guaranteed for the conduction band between the active layer 205 and the cladding layer 203 or 207, and an effective confinement is realized for the carriers injected into the active layer 205 from the electrodes 210 and 211. Thereby, the laser diode oscillates efficiently with a small threshold current and shows an excellent high temperature operational characteristic.

In the present embodiment, too, it is possible to add Al or P further to the GaInNAs mixed crystal forming the lower or upper multilayer reflection structure 202 or 209. However, the addition of these light elements to GaInNAs mixed crystal tends to cause a decrease of the refractive index, and the amount of Al or P that can be added to the GaInNAs mixed crystal is relatively limited.

[Third Embodiment]

Figure 5:
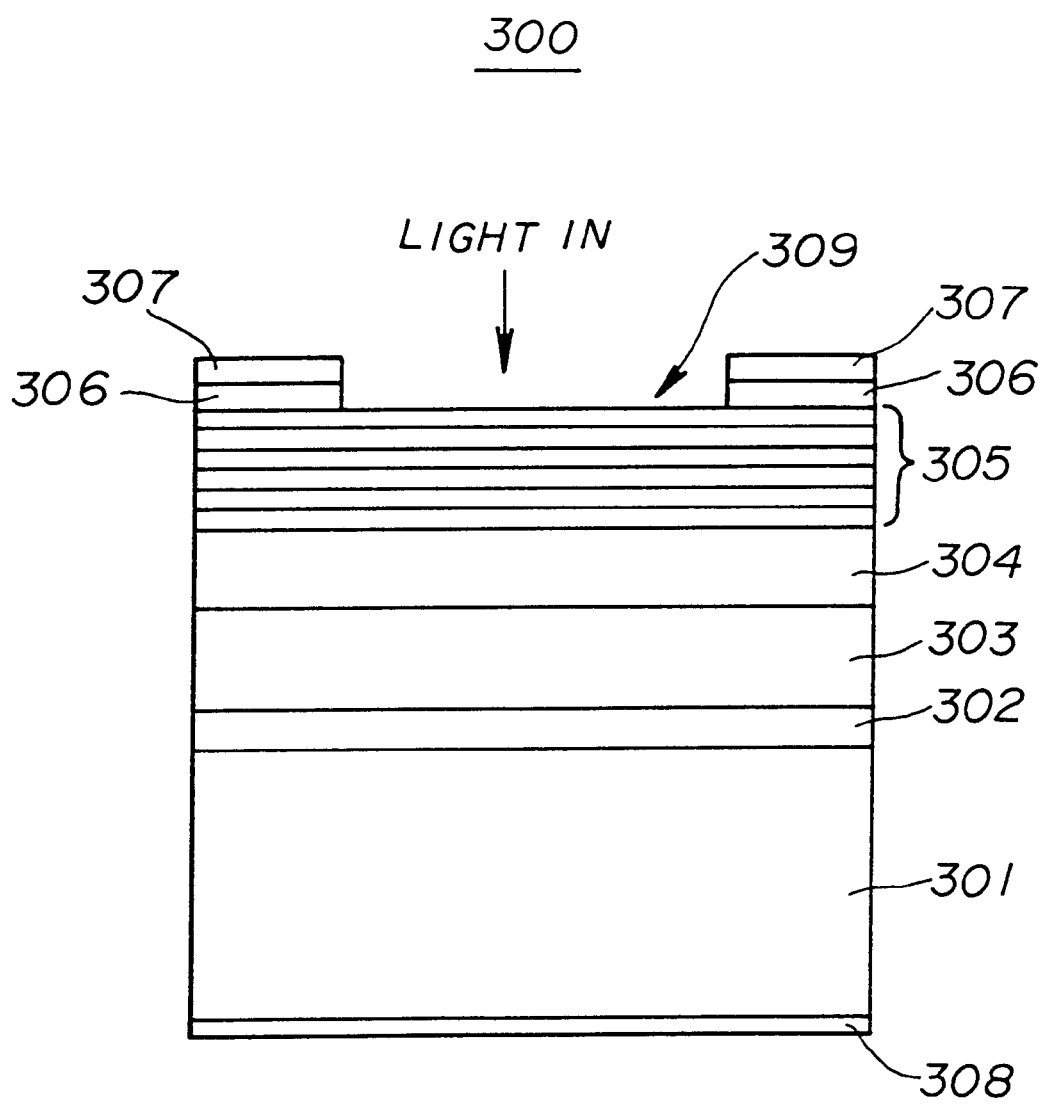
FIG. 5 is a diagram showing the construction of a PIN photodiode according to a third embodiment of the present invention.

FIG. 5 shows the construction of a PIN photodiode 300 according to a third embodiment of the present invention.

Referring to FIG. 5, the PIN photodiode 300 includes a substrate 301 of n-type GaAs on which a buffer layer 302 of n-type GaAs is provided epitaxially with a thickness of typically about 500 nm. On the buffer layer 302, an optical absorption layer 303 of undoped GaInNAs is provided epitaxially with a thickness of typically about 2000 nm, wherein the optical absorption layer 303 has a composition of $Ga_{0.85}In_{0.15}N_{0.05}As_{0.95}$ chosen so as to achieve a lattice matching to the GaAs substrate 301, wherein the GaInNAs mixed crystal of the foregoing composition has a bandgap energy corresponding to the optical radiation of the 1.5 μm wavelength.

On the optical absorption layer 303, a p-type GaInNAs layer 304 of the same composition is provided epitaxially with a thickness of typically about 500 nm, and an anti-reflection structure 305 is provided further on the p-type GaInNAs layer 304, wherein the anti-reflection structure 305 is formed of an alternate stacking of a p-type GaInNAs epitaxial layer and a p-type AlAs epitaxial layer repeated by 3 times. Similarly as before, the GaInNAs epitaxial layer may have the composition of $Ga_{0.87}In_{0.13}N_{0.04}As_{0.96}$ in lattice matching to the GaAs substrate 301, wherein the foregoing composition of the GaInNAs epitaxial layer is tuned to the 1.3 μm band optical wavelength for avoiding the absorption of the 1.5 μm band optical radiation to be detected.

On the anti-reflection structure 305, a ring-shaped contact layer 306 of p-type GaAs is provided so as to define an optical window 309, and a p-type ohmic electrode 307 having a corresponding ring-shaped form is provided further on the contact layer 306. In addition, an n-type ohmic electrode 308 is provided on the bottom surface of the active layer 301.

In operation, an external optical beam of the 1.5 μm wavelength band is received at the optical window 309 and reaches the optical absorption layer 303, after passing through the anti-reflection structure 305 and the p-type layer 304, wherein the anti-reflection structure 305 successfully eliminates reflection of the incident optical beam. The optical beam thus reached the optical absorption layer causes an optical excitation of electrons and holes, while the electrons and holes thus excited are caused to flow to the electrodes 307 and 308 as optical current, under an appropriate reverse biasing applied across the electrodes 307 and 308.

In the present embodiment, it should be noted that the number of the stacks of the AlAs and GaInNAs epitaxial layers in the anti-reflection structure 305 can be reduced to only three by using the GaInNAs mixed crystal having a large refractive index.

In the present embodiment, too, it is possible to add Al or P further to the GaInNAs mixed crystal forming the multilayer reflection structure 305. However, the addition of these light elements to GaInNAs mixed crystal tends to cause a decrease of the refractive index, and the amount of Al or P that can be added to the GaInNAs mixed crystal is relatively limited.

Further, the present invention is not limited to the embodiments described heretofore, but various variations and modifications may be made without departing from the scope of the invention.

What is claimed is:

1. A photodetector, comprising:
   a semiconductor substrate having a first conductivity type;
   an optical absorption layer of an undoped semiconductor material provided on said substrate;
   a semiconductor layer having a second, opposite conductivity type and provided on said optical absorption layer;
   a multilayer anti-reflection structure provided on said semiconductor layer, said multilayer anti-reflection structure comprising an alternate repetition of a first epitaxial layer having a first refractive index and a second epitaxial layer having a second refractive index larger than said first refractive index, said second epitaxial layer comprising a group III–V compound semiconductor material containing N as a group V element.

2. A photodetector as claimed in claim 1, wherein said substrate comprises GaAs.

3. A photodetector as claimed in claim 1, wherein said substrate comprises GaAs, and wherein said group III–V mixed crystal forming said second epitaxial layer comprises GaInNAs having a lattice constant substantially identical to a lattice constant of GaAs.

4. A photodetector as claimed in claim 3, wherein said active layer comprises a mixed crystal of GaInNAs having a lattice constant substantially identical to said lattice constant of GaAs and a bandgap energy corresponding to a 1.5 μm optical wavelength band, and wherein said mixed crystal of GaInNAs forming said second epitaxial layer has a bandgap energy larger than said bandgap energy of said active layer.

5. A photodetector as claimed in claim 4, wherein said group III–V mixed crystal forming said second epitaxial layer has a composition of $Ga_{0.87}In_{0.13}N_{0.04}As_{0.96}$.

6. A photodetector as claimed in claim 5, wherein said group III–V mixed crystal forming said active layer has a composition of $Ga_{0.85}In_{0.15}N_{0.05}As_{0.95}$.

* * * * *